United States Patent
Tomita

(10) Patent No.: US 8,436,402 B2
(45) Date of Patent: May 7, 2013

(54) EXPOSURE MASK USED FOR MANUFACTURING A SEMICONDUCTOR DEVICE HAVING IMPURITY LAYER AND A SEMICONDUCTOR DEVICE

(75) Inventor: Ken Tomita, Iwate-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/049,420

(22) Filed: Mar. 16, 2011

(65) Prior Publication Data

US 2011/0233619 A1    Sep. 29, 2011

(30) Foreign Application Priority Data

Mar. 23, 2010    (JP) .................................. 2010-066585

(51) Int. Cl.
*H01L 27/148*    (2006.01)
*H01L 31/062*    (2006.01)
*H01L 31/113*    (2006.01)

(52) U.S. Cl.
USPC ............................ 257/229; 257/240; 257/290

(58) Field of Classification Search .................. 257/225, 257/434, E27.133, E27.15, 229, 240, 290
See application file for complete search history.

(56) References Cited

U.S. PATENT DOCUMENTS

2007/0188683 A1* 8/2007 Naka .............................. 349/114
2008/0303071 A1* 12/2008 Hong ............................. 257/292

FOREIGN PATENT DOCUMENTS

JP    8-250446    9/1996
JP    2009-170653    7/2009

OTHER PUBLICATIONS

Office Action issued Apr. 3, 2012, in Japanese Patent Application No. 2010-066585 (with partial English-language translation).

* cited by examiner

*Primary Examiner* — Matthew Smith
*Assistant Examiner* — Wilner Jean Baptiste
(74) *Attorney, Agent, or Firm* — Oblon, Spivak, McClelland, Maier & Neustadt, L.L.P.

(57) ABSTRACT

An exposure mask according to an embodiment of the invention includes a first transmission region where a plurality of dots through which light is shielded or transmitted are arrayed into a matrix form having rows and columns and a second transmission region where a plurality of dots through which the light is shielded or transmitted are arrayed into a matrix form having rows and columns and is disposed adjacent to the first transmission region.
The dots arrayed in a row or a column of the first transmission region, which is adjacent to the second transmission region, have an area intermediate between areas of dots arrayed on both sides of the row or the column.

11 Claims, 18 Drawing Sheets

A charge transfer direction

The charge transfer direction

The charge transfer direction

The charge transfer direction

The charge transfer direction

The charge transfer direction

EXPOSURE MASK USED FOR MANUFACTURING A SEMICONDUCTOR DEVICE HAVING IMPURITY LAYER AND A SEMICONDUCTOR DEVICE

CROSS REFERENCE TO RELATED APPLICATIONS

This application is based upon and claims the benefit of priority from the prior Japanese Patent Application No. 2010-066585 filed in Japan on Mar. 23, 2010; the entire contents of which are incorporated herein by reference.

FIELD

Embodiments described herein relate generally to an exposure mask used for manufacturing a semiconductor device having an impurity layer, and a solid-state imaging device manufactured using the mask.

BACKGROUND

In a charge transfer unit, for example, a CCD unit of a conventional solid-state imaging device, a transfer electrode that transfers a charge is provided on an impurity layer, formed in a surface area of a semiconductor substrate, with an oxide film interposed between them. In the CCD unit, the impurity layer is formed in the surface area of the semiconductor substrate below each transfer electrode by implanting, for example, an n-type ion such that a profile is deepened toward a charge transfer direction. An electric potential deepened toward the charge transfer direction is formed below each transfer electrode by the impurity layer having the profile described. Accordingly, the charge can efficiently be transferred in the CCD unit.

It is well known that the impurity layer can be formed using a so-called grating mask in which plural transmission regions are formed in which a light transmittance gradually changes. The grating mask is formed by a dot pattern, in which dot-shaped light shielding portions (hereinafter referred to as "dot") through which the light is not transmitted are regularly arrayed on a surface of a glass plate through which the light is transmitted. In the dot pattern, an area of each dot is changed while the number of dots per unit area is kept constant, thereby changing the light transmittance. The grating mask controls the light transmittance by the area of each dot constituting the dot pattern.

Alternatively, the grating mask may be formed by a dot pattern, in which dot-shaped translucent portions through which the light is transmitted are regularly arrayed on a surface of a glass plate through which the light is not transmitted. Accordingly, the term of "dot pattern" means the dot patterns in both the above-described grating masks.

The shape of the dot is not limited to the square, but the dot may be formed into a polygonal shape or a circular shape.

A method for forming the impurity layer using the grating mask will be described below. A resist material is evenly applied on the semiconductor substrate. Then the resist material is exposed using the grating mask. When the exposed resist material is developed, a resist-remaining film is thinned in a region having the higher light transmittance. Accordingly, the plural resist films whose film thicknesses are thinned toward the charge transfer direction are repeatedly formed on the semiconductor substrate. When ions are implanted into the semiconductor substrate through the resist film as a mask, the impurity layer that is deepened toward the charge transfer direction can be formed by the ion implantation process with one step.

However, in the impurity layer formed in the above-described process, the inventors of the present invention found that a potential dip is formed in a step portion of a stepwise potential profile, and therefore charge transfer efficiency is degraded. The problem prevents further improvements in the device.

In view of the foregoing, an exposure mask that can improve the charge transfer efficiency, a method for manufacturing the semiconductor device having the impurity layer and a solid-state imaging device are provided.

In accordance with an aspect of the invention, an exposure mask includes a first transmission region, a second transmission region and a third transmission region that is located between the first transmission region and the second transmission region. In the exposure mask, light transmittances of the first transmission region and the second transmission region discontinuously change in a boundary portion between the first transmission region and the second transmission region. The first transmission region includes a first dot pattern where light is shielded or transmitted, and the first dot pattern includes an array of plural dots. The second transmission region adjacent to the first transmission region includes a second dot pattern, and the second dot pattern includes an array of plural dots. In the second dot pattern, an area of the dot is larger than that of the dot of the first dot pattern. The third transmission region includes a third dot pattern, and the third dot pattern includes an array of plural dots. In the third dot pattern, the dot has an area intermediate between the dot of the first dot pattern and the dot of the second dot pattern.

In accordance with another aspect of the invention, a method for manufacturing a semiconductor device having an impurity layer includes the steps of applying a resist material on a surface of a semiconductor substrate, exposing the resist material, developing the exposed resist material and forming the impurity layer. In the step of exposing the resist material, the resist material is exposed using the exposure mask described. In the step of forming the impurity layer, the impurity layer is formed by implanting ions into the semiconductor substrate from above a resist film formed by developing the resist material.

In accordance with still another aspect of the invention, a solid-state imaging device includes a first-conductive-type well that is formed on a surface of a semiconductor substrate, a first impurity layer, a second-conductive-type second impurity layer and a first electrode. The first impurity layer is formed on a surface of a well to act as a photodiode. The second impurity layer is formed on the surface area of the well apart from the first impurity layer in a charge transfer direction. The second impurity layer includes a front-step portion that is deepened toward the charge transfer direction and a rear-step portion that is deepened toward the charge transfer direction with a gradient larger than that of the front-step portion. The first electrode is formed on the second impurity layer and on the well between the second impurity layer and the first impurity layer while an insulating film is interposed between them.

An exposure mask, a method for manufacturing a semiconductor device having an impurity layer and a solid-state imaging device according to embodiments of the present invention will be described in detail with reference to the drawings.

DETAILED DESCRIPTION

Figure 1:
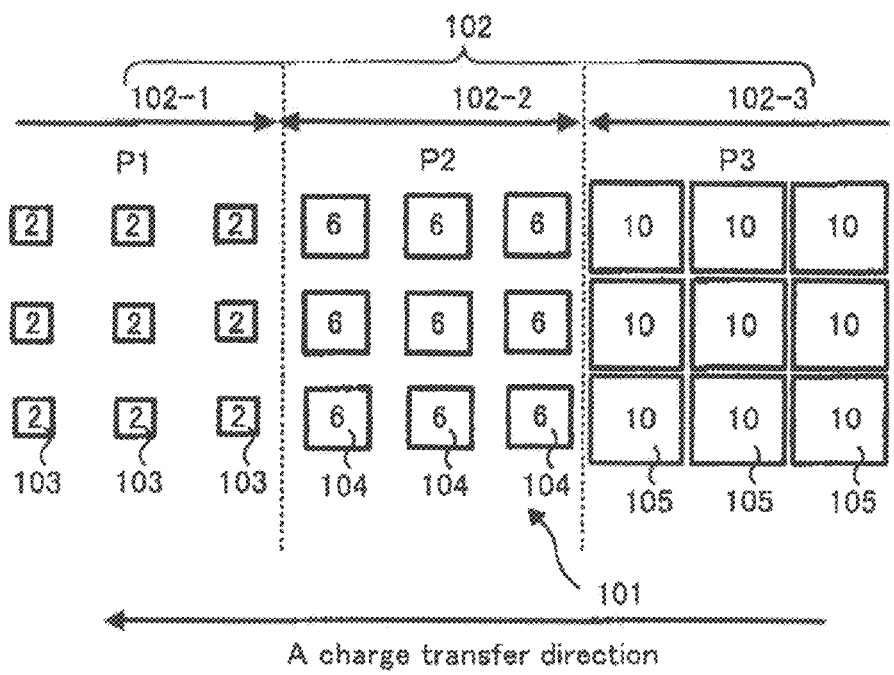
FIG. 1 is an enlarged plan view schematically illustrating a part of a conventional grating mask.
Figure 2:
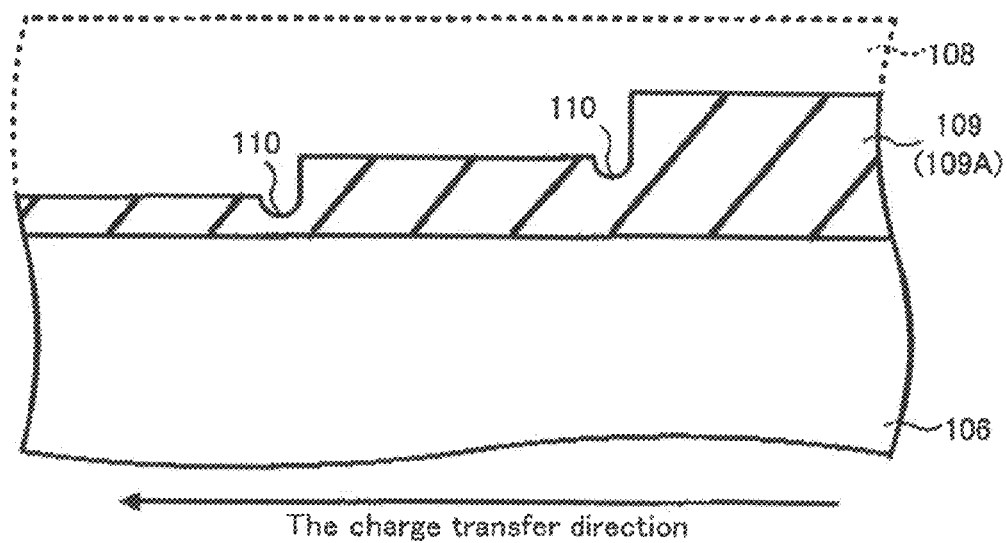
FIG. 2 is a view for illustrating a process of manufacturing a conventional charge transfer unit and a sectional view of the charge transfer unit along a charge transfer direction.
Figure 3:
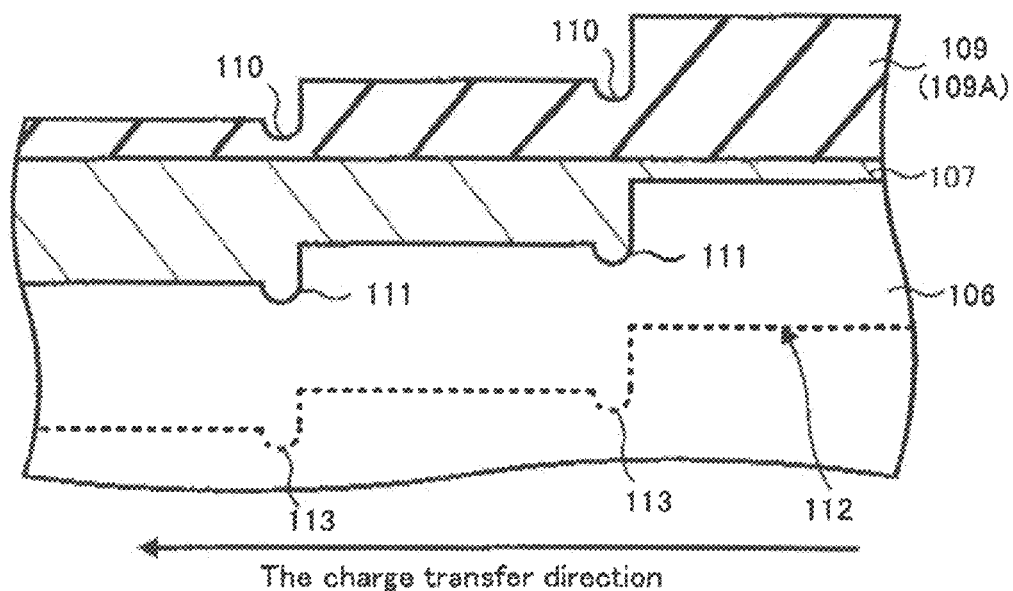
FIG. 3 is a view for illustrating the process of manufacturing the conventional charge transfer unit and a sectional view of the charge transfer unit along the charge transfer direction.

First, a principle of the invention will be described by comparison with a conventional impurity layer forming method in which a grating mask is used. Referring to FIG. 1 to FIG. 3, a method for forming an impurity layer that is deepened in a stepwise manner into a semiconductor substrate below each of plural transfer electrodes in a COD charge transfer unit in which the plural transfer electrodes are arrayed with an insulating film interposed there between will be described in detail as an example of the conventional impurity layer forming method in which the grating mask is used.

FIG. 1 is an enlarged plan view schematically illustrating a part of the grating mask used in a conventional method for manufacturing a charge transfer unit. In FIG. 1, small and large squares express dots through which light is not transmitted. A numerical value indicated in the squares indicates a relative area of each dot, which increases as the numerical value increases as shown in FIG. 1.

As illustrated in FIG. 1, a transmission region 102 of a conventional grating mask 101 includes a first transmission region 102-1 having the highest transmittance, a second transmission region 102-2 the transmittance of which is lower than that of the first transmission region 102-1, and a third transmission region 102-3 the transmittance of which is lower than that of the second transmission region 102-2. In the transmission region 102, the first transmission region 102-1 to the third transmission region 102-3 are arrayed in such manner that such that the transmittance is increased in a stepwise manner toward a charge transfer direction. Here, the first transmission region 102-1, the second transmission region 102-2 and the third transmission region 102-3 is formed so as to correspond to one of plural charge transfer electrodes respectively (not illustrated).

A first dot pattern P1 is formed in the first transmission region 102-1 having the highest transmittance, in which dots 103 having the smallest area in the transmission region 102 are arrayed. A second dot pattern P2 is formed in the second transmission region 102-2, in which dots 104 having the area larger than that of the dot 103 of the first dot pattern P1 are arrayed. A third dot pattern P3 is formed in the third transmission region 102-3, in which dots 105 having the area larger than that of the dot 104 of the second dot pattern P2 are arrayed.

FIG. 2 and FIG. 3 are views illustrating a method for manufacturing a charge transfer unit in which the grating mask 101 is used.

As illustrated in FIG. 2, a resist material 108 is applied on a semiconductor substrate 106. Then the resist material 108 is exposed using the grating mask 101 of FIG. 1 and the exposed resist material 108 is developed to form a resist film 109. A thin-film portion 109A is formed in the resist film 109 such that a film thickness is thinned in the stepwise manner toward the charge transfer direction. An impurity layer 107 (see FIG. 3) is formed by implanting ions into the semiconductor substrate through the resist film 109. After the resist film 109 is removed, the plural transfer electrodes (not illustrated) are formed with the insulating film interposed there between. At this point, the transfer electrode has a length in the charge transfer direction so as to cover the whole of the first transmission region 102-1, the second transmission region 102-2, and the third transmission region 102-3.

The inventors of the present invention have found that the following problem is generated in the process of forming the resist film 109. As is clear from FIG. 2, a recess 110 is formed in the resist film 109 immediately below each of a boundary portion between the first transmission region 102-1 and the second transmission region 102-2 of the grating mask 101 of FIG. 1 and a boundary portion between the second transmission region 102-2 and the third transmission region 102-3.

When the ions are implanted into the semiconductor substrate 106 using, as a mask, the resist film 109, which includes the thin-film portion 109A in which the recess 110 is formed, the impurity layer 107 having a depth profile corresponding to the film thickness of the thin-film portion 109A is formed as illustrated in FIG. 3. At this point, a recess 111 corresponding to the recess 110 of the resist film 109 is partially formed in the impurity layer 107. In the recess 111, the impurity is deeply formed beyond necessity.

When the impurity layer 107 including the recess 111 is formed, a potential dip 113 is formed in a potential profile formed by the impurity layer 107 at a step portion of the potential that changes in the stepwise manner as illustrated by a dotted line 112 in FIG. 3. Accordingly, in the impurity layer 107, the charge transferred toward the direction in which the potential is deepened remains in the potential dip 113. This has been obstructed further improvement of the charge transfer efficiency.

It is not certain why the recess 110 is formed in the resist film 109 when the impurity layer is formed using the conventional grating mask. However, this is attributed to the fact that the boundary portion between the first transmission region 102-1 and the second transmission region 102-2 of the grating mask 101 and the boundary portion between the second transmission region 102-2 and the third transmission region 102-3 are higher than the second transmission region 102-2 or the third transmission region 102-3 in the light transmittance. Generally there is well known a phenomenon in which the light transmittance in the boundary region between two regions having different transmittances becomes higher than that in any region due to interference or diffraction of the light.

As described above, the stepwise impurity layer 107 can easily be produced through less number of process steps using the grating mask 101 illustrated in FIG. 1. However, as described above, the inventors have found the problem as a result of a study on a structure of the charge transfer unit including the impurity layer 107 produced in the above-described way. The embodiments of the present invention provide a resolution on the above problem found by the inventors.

An exposure mask and a method for manufacturing a semiconductor device using the exposure mask according to an embodiment of the present invention will be described below.

Figure 4:
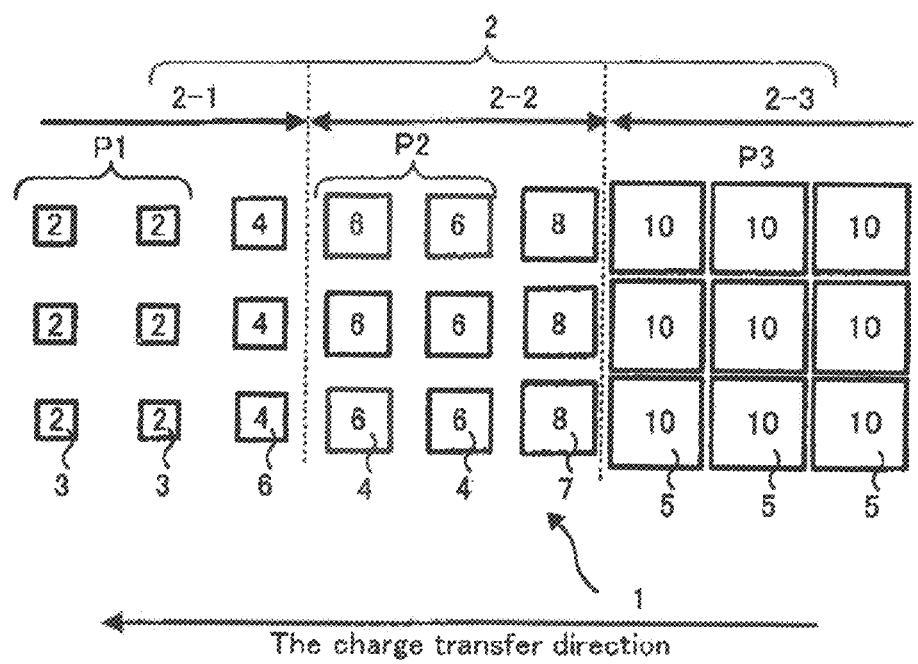
FIG. 4 is an enlarged plan view schematically illustrating a part of a grating mask according to an embodiment of the invention.

FIG. 4 is an enlarged plan view schematically illustrating a part of a grating mask used in the method for manufacturing a semiconductor device according to an embodiment of the invention. In a transmission region 2 of a grating mask 1, a first, a second and a third dot patterns P1, P2, and P3, dot areas of which are sequentially increased are formed in a first, a second and a third regions 2-1, 2-2, and 2-3 in a similar manner to the grating mask shown in FIG. 1. However, the first, second and third dot patterns P1, P2, and P3 differ from the dot patterns of the grating mask shown in FIG. 1 in the following point. That is, in a boundary region between the first region 2-1 and the second region 2-2, dots 6 having an area intermediate between a dot 3 and a dot 4 are arrayed in part on the side of the first region 2-1 having the larger transmittance. Similarly, in a boundary region between the second region 2-2 and the third region 2-3, a dot pattern 7 having an area intermediate between the dot 4 and a dot 5 is formed in part on the side of the second region 2-2 having the larger transmittance.

Specifically, assuming that the dot 3 of the first region 2-1 has an area of 2, the dot 4 of the second region 2-2 has an area of 6, and the dot 5 of the third region 2-3 has an area of 10, the dot 6 in the boundary region between the first region 2-1 and the second region 2-2 has an area of 4 intermediate between the dot 3 and the dot 4. The dot 7 in the boundary region between the second region 2-2 and the third region 2-3 has an area of 8 intermediate between the 6 of dot 4 and 10 of the dot 5.

The intermediate area means that it is smaller than a larger area of a dot and larger than a smaller area of a dot in the boundary region of adjacent dot patterns having a different dot area. A specific value of the area is selected such that the light transmittance of the whole dot pattern including the intermediate area becomes constant. That is, the value of the area is selected such that the recess 110 is not formed in the resist film 109 illustrated in FIG. 2.

Figure 5:
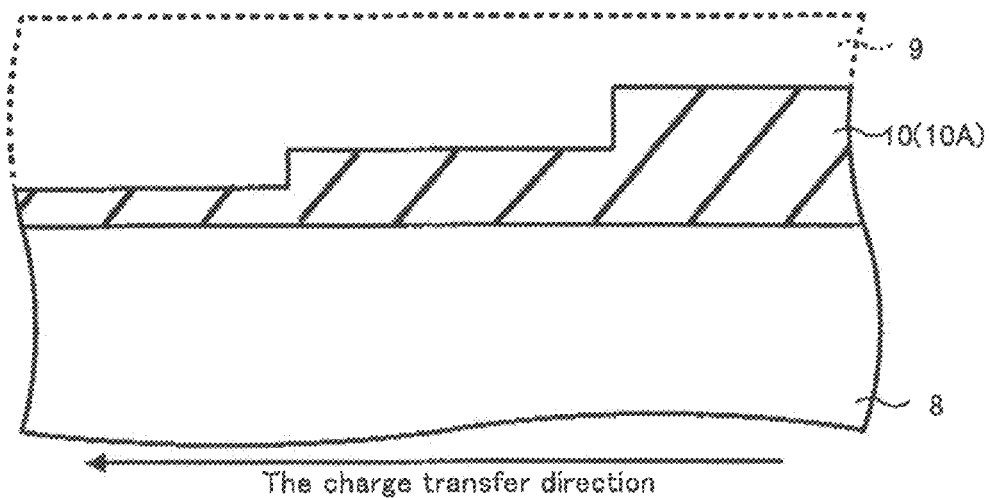
FIG. 5 is a view for illustrating a charge transfer unit manufacturing process in which the grating mask of FIG. 4 is used and a sectional view of the charge transfer unit along the charge transfer direction.
Figure 6:
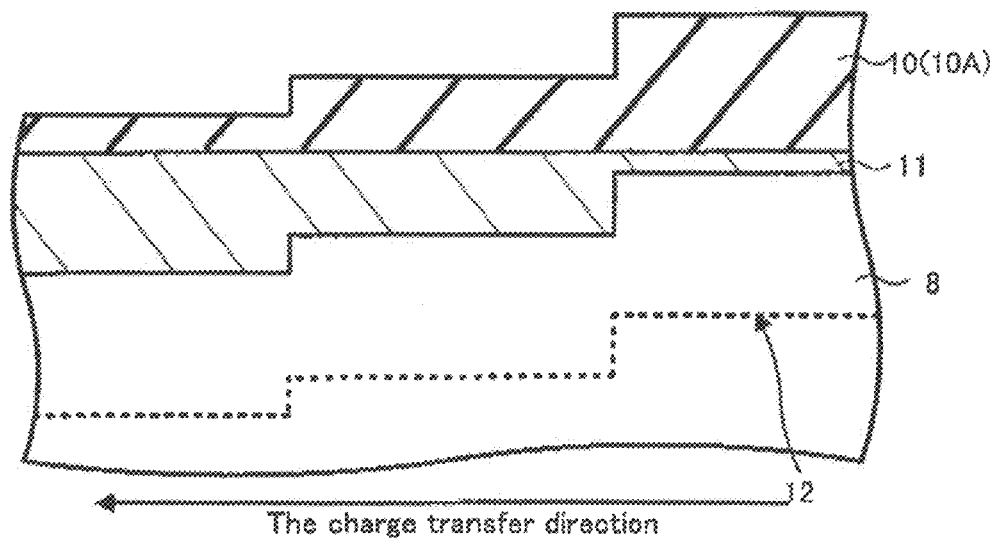
FIG. 6 is a view for illustrating the charge transfer unit manufacturing process in which the grating mask of FIG. 4 is used and a sectional view of the charge transfer unit along the charge transfer direction.

FIG. 5 and FIG. 6 are views for explaining a method for manufacturing a charge transfer unit in which the grating mask 1 having the above-described structure is used.

As illustrated in FIG. 5, a resist material 9 is applied on a semiconductor substrate 8. Then the resist material 9 is exposed using the grating mask 1 shown in FIG. 4, and the resist material 9 is developed to form a resist film 10. A thin-film portion 10A is formed in the resist film 10 such that a film thickness is thinned in the stepwise manner toward the charge transfer direction.

In the grating mask 1 of an embodiment of the invention, the areas of the dots 6 and 7 formed in the boundary region of the first region 2-1 and the boundary region of the second region 2-2 are larger than those of the conventional grating mask. Accordingly, the light transmittance in the boundary region can be equalized to that of the region except the boundary region. This means that the light transmittance is reduced compared with the boundary region of the conventional grating mask. Therefore, the formation of the recess 110 of FIG. 2 is suppressed in the step portion in which the film thickness changes in the stepwise manner in the resist film 10 that is produced using the grating mask 1.

When the ions are implanted into the semiconductor substrate 8 using the resist film 10, in which the formation of the recess 110 is suppressed, as a mask, an impurity layer 11 having a depth profile corresponding to the film thickness of the thin-film portion 10A is formed as illustrated in FIG. 6. That is, the formation of the recess 111 of FIG. 3 is suppressed in the impurity layer 11.

When the impurity layer 11 having the depth profile in which the formation of the recess 111 is suppressed is formed, the potential profile is formed by the impurity layer 11 so as to falls in the stepwise manner as illustrated by a dotted line 12 of FIG. 6, and the formation of the potential dip 113 of FIG. 3 is suppressed in the step portion of the potential. In the solid-state imaging device including the impurity layer 11 formed by the manufacturing method of the embodiment, the charge is prevented from remaining in the potential dip during the charge transfer. Accordingly, the charge transfer efficiency of the charge transfer unit can be improved.

Then embodiments of the invention will specifically be described in detail with reference to the drawings. Hereinafter, a method for manufacturing a solid-state imaging device will be described as an example of a method for the manufacturing a semiconductor device. In the following embodiments, the mask formed by the dot pattern in which the dot-shaped light shielding portions through which the light is not transmitted are regularly arrayed on the surface of the glass plate through which the light is transmitted is described as the grating mask. However, obviously the invention is not limited to the masks of the embodiments.

(First Embodiment)

Figure 7:
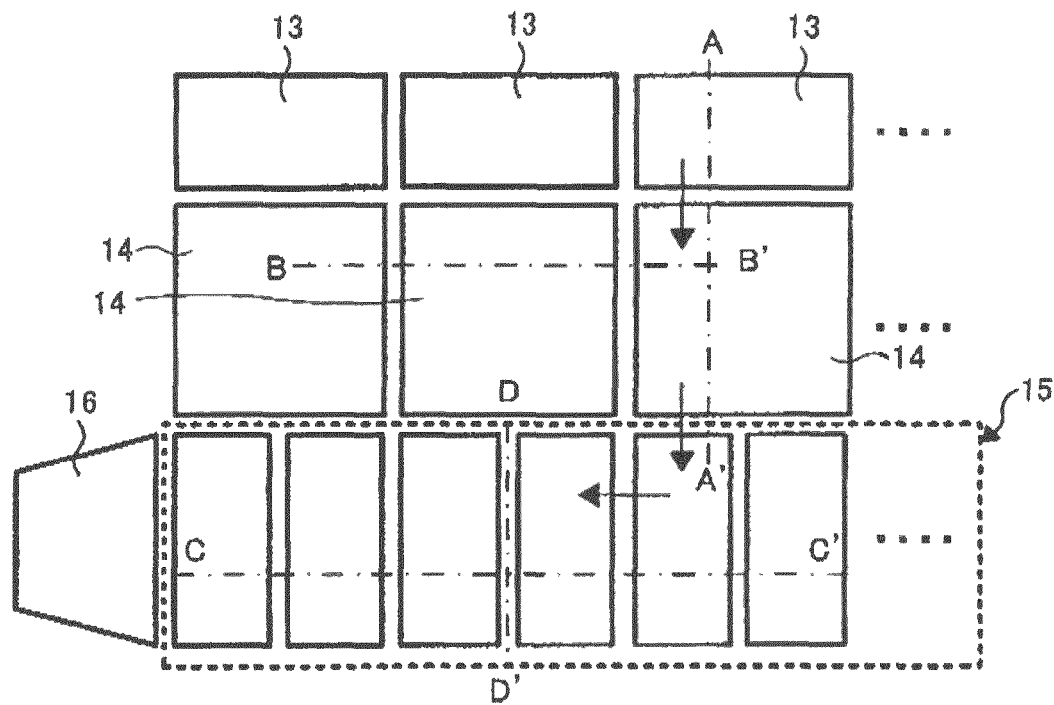
FIG. 7 is a plan view schematically illustrating a main part of a solid-state imaging device manufactured by a manufacturing method of a solid-state imaging device according to a first embodiment of the invention.

A solid-state imaging device manufactured by a method for manufacturing a solid-state imaging device according to a first embodiment of the present invention will be described below. FIG. 7 is a plan view schematically illustrating a main part of the solid-state imaging device manufactured by the method for manufacturing a solid-state imaging device according to the first embodiment. As illustrated in FIG. 7, the solid-state imaging device includes a pixel unit 13, a charge accumulation unit 14, and a charge transfer unit 15 (hereinafter referred to as a CCD unit 15). For example, the pixel unit 13, the charge accumulation unit 14, and the CCD unit 15 are formed on a P-type semiconductor substrate.

The pixel unit 13 is a photodiode that generates a charge according to the received light. For example, the plural pixel units 13 are formed in a line while separated from one another.

The charge accumulation unit 14 reads and accumulates the charge generated in the pixel unit 13, and to the charge transfer unit, namely, the CCD unit 15, the accumulated charge is transferred. The charge accumulation unit 14 is formed between the pixel unit 13 and the CCD unit 15.

The CCD unit 15 transfers the charge transferred from the charge accumulation unit 14 to a floating diffusion unit 16 (FD unit 16) formed in a final step of the CCD unit 15. The CCD unit 15 is formed in substantially parallel with the line of the pixel units 13.

The FD unit 16 is a charge-voltage conversion unit that outputs a voltage based on a transferred charge amount.

Figure 8:
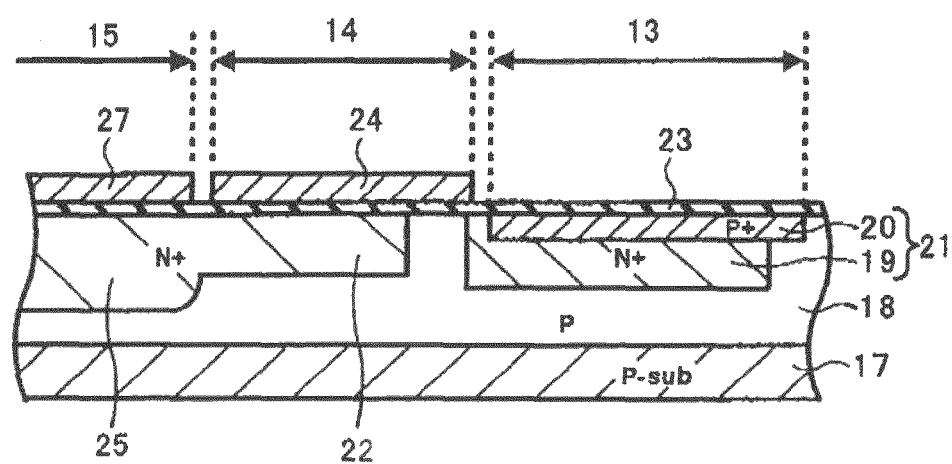
FIG. 8 is a sectional view of a pixel unit and a charge accumulation unit taken along a line A-A' of FIG. 7.
Figure 9:
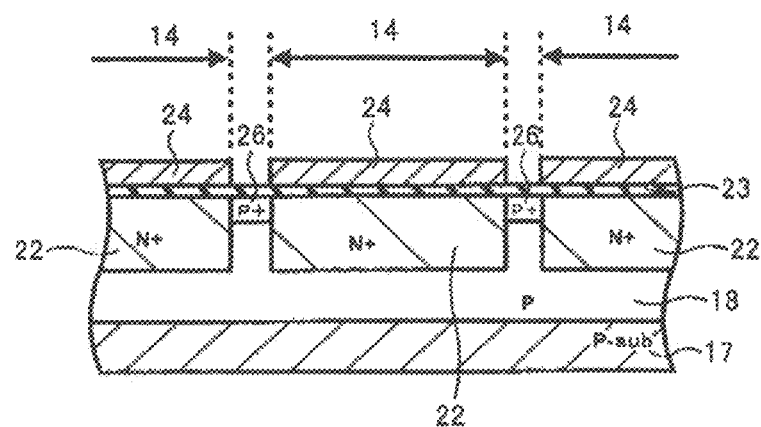
FIG. 9 is a sectional view of the charge accumulation unit taken along a line B-B' of FIG. 7.

Then the pixel unit 13 and the charge accumulation unit 14 will be described in detail with reference to FIG. 8 and FIG. 9. FIG. 8 is a partially sectional view of the pixel unit 13 and the charge accumulation unit 14 taken on a line A-A' of FIG. 7. FIG. 9 is a partially sectional view of the charge accumulation unit 14 taken on a line B-B' of FIG. 7.

As illustrated in FIG. 8, the pixel unit 13 and the charge accumulation unit 14 are formed in a P-type well 18 provided on the surface of a P-type semiconductor substrate 17. Each pixel unit 13 includes a first N+-type impurity layer 19 formed on the surface of the well 18 and a first P+-type impurity layer 20 formed on the surface of the first N+-type impurity layer 19.

The first N+-type impurity layer 19 is formed in the pixel unit 13 and between the pixel unit 13 and the charge accumulation unit 14. The first P+-type impurity layer 20 is formed in the pixel unit 13. The impurity layers 19 and 20 act as a photodiode 21. In addition to the photodiode 21, each pixel unit 13 includes a micro lens (not illustrated) that focuses the light onto the photodiode 21 and a color filter (not illustrated).

As illustrated in FIG. 8, each charge accumulation unit 14 includes a second N+-type impurity layer 22 and a first transfer electrode 24. The second N+-type impurity layer 22 is formed on the surface of the well 18 while separated from the first N+-type impurity layer 19.

The second N+-type impurity layer 22 is formed so as to extend to the region between the charge accumulation unit 14 and the CCD unit 15. The second N+-type impurity layer 22 is formed so as to be joined to a third N+-type impurity layer 25 of the CCD unit 15.

As illustrated in FIG. 9, the second N+-type impurity layer 22 is formed with a width that is substantially identical to that of the first transfer electrode 24. The second N+-type impurity layers 22 are formed in parallel with one another while separated from one another.

A second P+-type impurity layer 26 is formed between adjacent two of the second N+-type impurity layers 22. The second P+-type impurity layer 26 is provided to prevent the charge transferred through the second N+-type impurity layer 22 from moving to the adjacent second N+-type impurity layer 22.

As illustrated in FIG. 8, the first transfer electrode 24 is formed on the second N+-type impurity layer 22 and on the well 18 between the second N+-type impurity layer 22 and the first N+-type impurity layer 19 while an insulating film 23 is interposed there between. For example, the first transfer electrode 24 is made of poly silicon.

Figure 10:
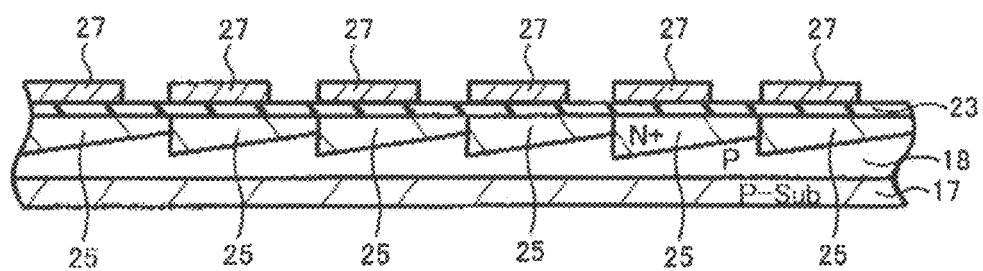
FIG. 10 is a sectional view of a CCD unit taken along a line C-C' of FIG. 7.
Figure 11:
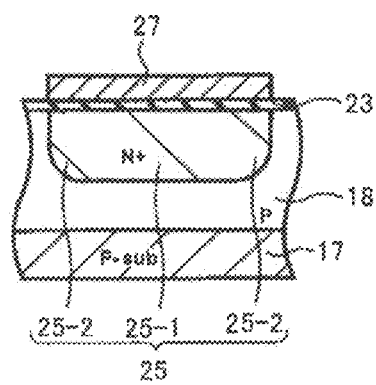
FIG. 11 is a sectional view of the CCD unit taken along a line D-D' of FIG. 7.

Then the CCD unit 15 will be described in detail with reference to FIG. 10 and FIG. 11. FIG. 10 is a sectional view of the CCD unit 15 taken on a line C-C' of FIG. 7. FIG. 11 is a sectional view of the CCD unit 15 taken on a line D-D' of FIG. 7.

As illustrated in FIG. 10, the CCD unit 15 includes the plural third N+-type impurity layers 25 that are formed in a line on the surface of the well 18 and plural rectangular second transfer electrodes 27 each of which is formed on the third N+-type impurity layer 25 with the insulating film 23 interposed there between.

As illustrated in FIG. 10, the third N+-type impurity layer 25 is formed so as to be deepened at a constant rate toward the charge transfer direction. Each of the third N+-type impurity layers 25 is formed such that a point at which the impurity is most deeply formed is joined to a point at which the impurity is most shallowly formed in the adjacent third N+-type impurity layer 25.

As illustrated in FIG. 11, the third N+-type impurity layer 25 is formed such that impurity depths of both side portions 25-2 are shallower than an impurity depth of a central portion 25-1.

As illustrated in FIG. 10, the second transfer electrodes 27 are formed while separated from one another. Each of the second transfer electrodes 27 is formed such that one side constituting the shape of the electrode 27 is matched with the point at which the impurity is most deeply formed in the third N+-type impurity layer 25. For example, the second transfer electrode 27 is made of poly silicon.

The charge through which the CCD unit 15 is finally transferred is transferred to the FD unit 16 illustrated in FIG. 7. The FD unit 16 generates the voltage according to the transferred charge amount. An image output by the solid-state imaging device can be obtained based on the voltage generated by the FD unit 16.

Then a method for manufacturing the CCD unit 15 will be described with reference to FIG. 12 to FIG. 20.

Figure 12:
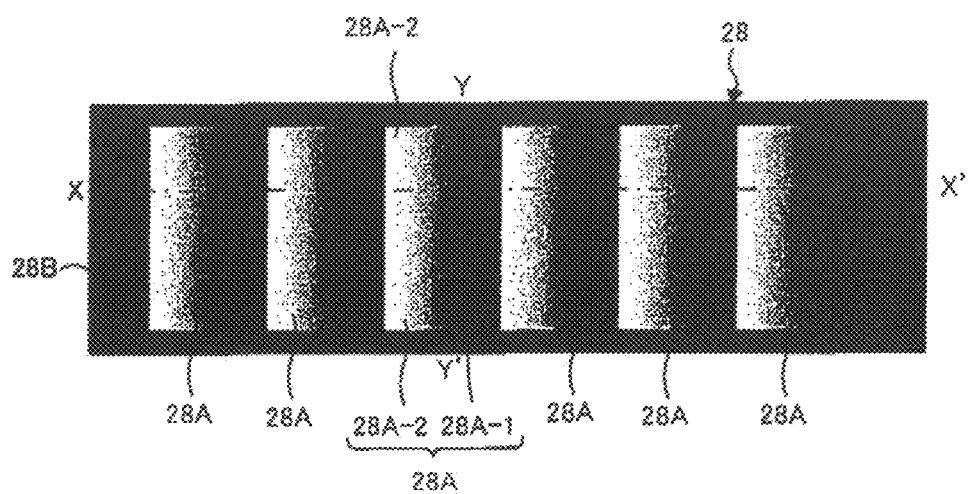
FIG. 12 is a plan view of a grating mask used to produce the solid-state imaging device of FIG. 7.

FIG. 12 is a plan view illustrating a structure of a grating mask 28. As illustrated in FIG. 12, the grating mask 28 has the structure in which plural transmission regions 28A where the light transmittances gradually change according to a position are surrounded by a low transmission region 28B having a low light transmittance. For example, the grating mask 28 has a dot pattern in which many dots formed by light shielding films such as chromium films are regularly arrayed into a matrix shape on a transparent resin substrate such as a glass substrate. In a row direction of the matrix, the dots constituting the dot pattern are formed such that the area is gradually reduced from an upstream side 28A-1 toward a downstream side 28A-2 in the charge transfer direction (X-X'). Dot pattern having the larger area is formed in the low transmission region 28B around the transmission region 28A. The Y-Y' direction of the drawings is a column direction of the matrix as well as a width direction of the charge transfer region.

In order to describe the detailed grating mask 28 of FIG. 12, a transmittance characteristic and the structure of the grating mask 28 in the direction along the line X-X' of FIG. 12 will be described with reference to FIG. 13 and FIG. 14.

Figure 13:
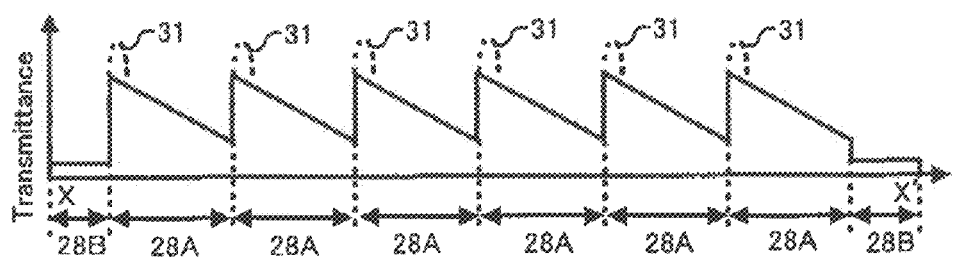
FIG. 13 is a view illustrating a transmittance characteristic of the grating mask along a line X-X' of FIG. 12.

FIG. 13 is a view illustrating the transmittance characteristic of the grating mask 28 along the line X-X' of FIG. 12. In FIG. 13, a horizontal axis indicates a position along the X-X' direction in the grating mask 28 and a vertical axis indicates the transmittance. As illustrated in FIG. 13, the light transmittance along the charge transfer direction (X-X') of the grating mask 28 is continuously increased toward the charge transfer direction in each transmission region 28A.

Figure 14:
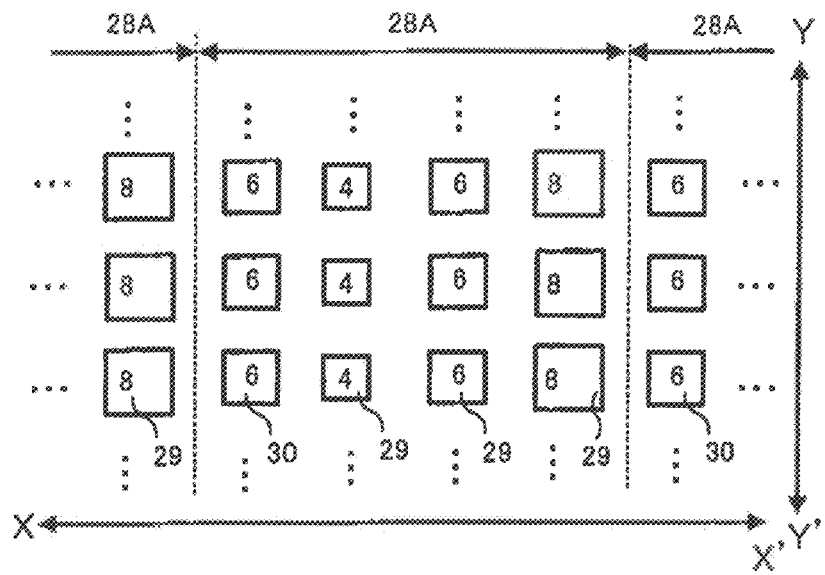
FIG. 14 is an enlarged plan view schematically illustrating a part of the grating mask of FIG. 12.

FIG. 14 is an enlarged plan view schematically illustrating a part of the grating mask 28 of FIG. 12. In FIG. 14, small and large squares express dots through which light is not transmitted. A numerical value indicated in the dot of FIG. 14 indicates a relative area of each dot, and the area of the dot is increased with increasing numerical value of FIG. 14. The line X-X' in FIG. 14 corresponds to the line X-X' in FIG. 12.

In one transmission region 28A of the grating mask 28, plural dots 29 are formed such that the area is gradually reduced toward the charge transfer direction as illustrated in FIG. 14. Accordingly, the light transmittance is gradually increased toward the charge transfer direction. However, in the boundary portion between the transmission regions 28A having the large difference in transmittance, each of dots 30 arrayed in the column direction of the matrix has an area intermediate between areas of two dots 29 adjacent to the dot 30.

Specifically, for example, the dots 29 arrayed in the transmission region 28A are formed such that the area is reduced at a constant rate like 8, 6, and 4 toward the charge transfer direction. On the other hand, the dots 30 arrayed in the leading end portion in the charge transfer direction of the transmission region 28A are formed so as not to have the area of 2 as in the conventional mask but to have the area of 6 intermediate between the area of 4 and the area of 8. That is, the area of each of the dots 30 arrayed in the leading end portion of the transmission region 28A is larger than that of the conventional grating mask. The dots 29 and 30 are repeatedly formed in each transmission region 28A.

The dots 29 and 30 in the transmission region 28A are formed as illustrated in FIG. 14, whereby the light transmission area of the transmission region 28A is increased toward the charge transfer direction while the light transmission area is formed smaller than that of the conventional grating mask in the leading end portion of the transmission region 28A. Accordingly, as illustrated by a dotted line 31 of FIG. 13, the light transmittance is prevented from being increased beyond necessity in the leading end portion of the transmission region 28A. Therefore, the transmittance characteristic in which the transmittance is continuously increased at a constant rate toward the charge transfer direction can be achieved.

Specifically, the intermediate area of the dot 30 is selected such that the whole light transmittance in the X-X' direction of the transmission region 28A is increased at a constant rate toward the charge transfer direction.

The transmittance characteristic and structure of the grating mask 28 along the line Y-Y' of FIG. 12 will be described below with reference to FIG. 15 and FIG. 16.

Figure 15:
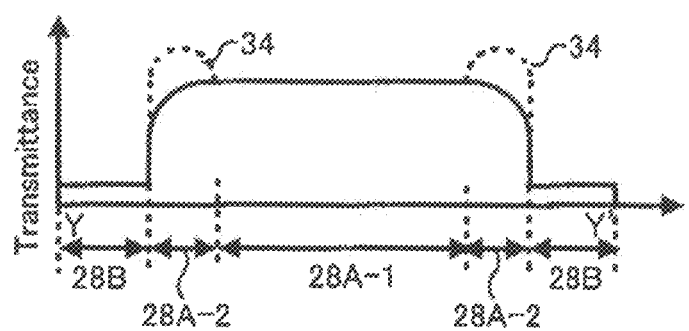
FIG. 15 is a view illustrating the transmittance characteristic of the grating mask along a line Y-Y' of FIG. 12.

FIG. 15 is a view illustrating the transmittance characteristic of the grating mask 28 along the line Y-Y' of FIG. 12. In FIG. 15, the horizontal axis indicates a position along the Y-Y' direction in the grating mask 28 and the vertical axis indicates the transmittance. As illustrated in FIG. 15, the light transmittance in a direction perpendicular to the charge transfer direction is kept constant in the central portion 28A-1 of the transmission region 28A. On the other hand, in both side portions 28A-2 of the transmission region 28A, the transmittance is lower than that of the central portion 28A-1.

Figure 16:
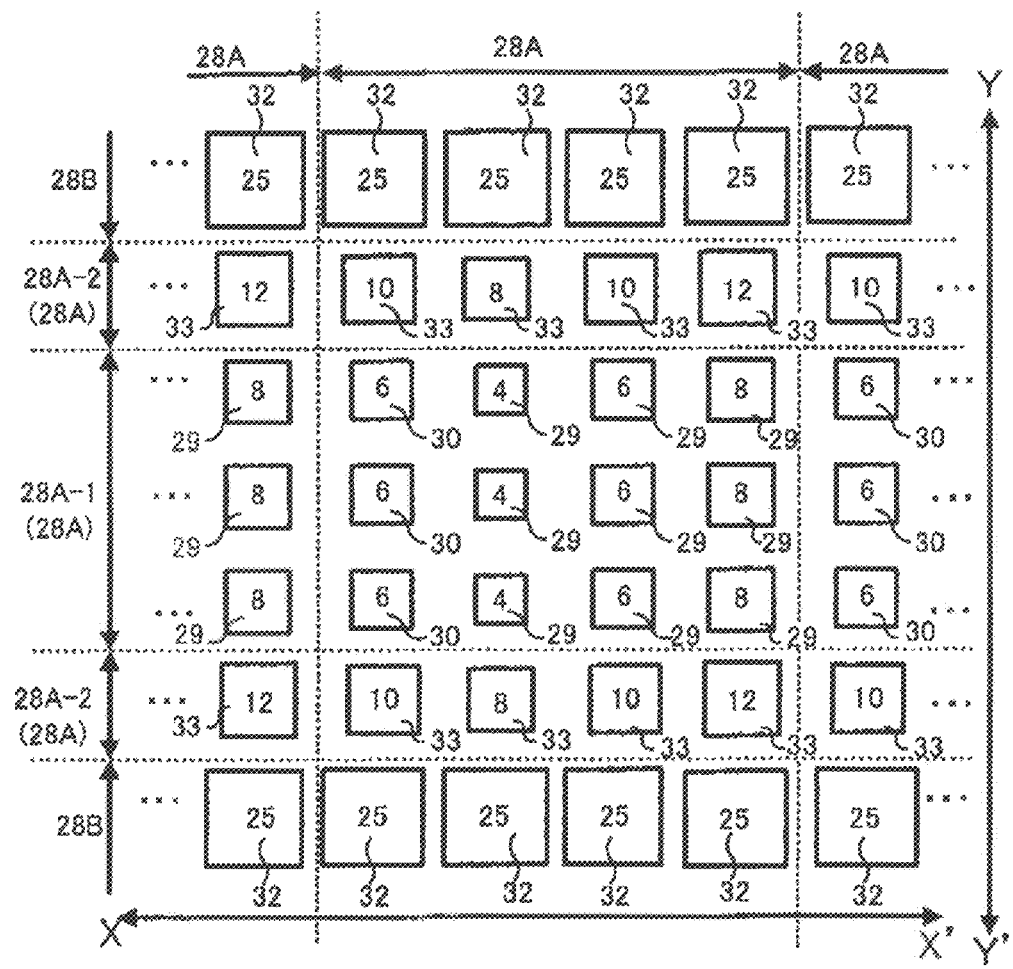
FIG. 16 is an enlarged plan view schematically illustrating a part of the grating mask of FIG. 12.

FIG. 16 is an enlarged plan view schematically illustrating a part of the grating mask 28 of FIG. 12. FIG. 16 is an enlarged view schematically illustrating a part of the grating mask 28 of FIG. 14 and a surrounding portion thereof. In FIG. 16, the large and small squares and the numerical value in the square have the meanings identical to those of FIG. 14, and the X-X' direction and Y-Y' direction of FIG. 16 correspond to the lines X-X' and Y-Y' of FIG. 12, respectively.

As illustrated in FIG. 16, dot patterns 32 having larger areas are arrayed into the matrix shape in the low transmission region 28E of the grating mask 28. In FIG. 16, for example, the dot 32 has the area of 25.

In the transmission region 28A of the grating mask 28, the dots 29 and 30 in the central portion 28A-1 of FIG. 14 are formed along the column direction of the matrix, that is, the Y-Y' direction such that the areas become equal to each other as illustrated in FIG. 16.

On the other hand, dots 33 are formed in the boundary portion with the low transmission region 288, that is, both end portions 28A-2 of the transmission region 28A in the transmission region 28A. Each of dots 33 has an area intermediate between the dots 29 and 30 formed in the central portion 28A-1 and a dot 32 formed in the low transmission region 28B.

Specifically, the dots 29 and 30 formed in the central portion 28A-1 of the transmission region 28A are formed such that the areas (for example, area of 6) become equal to each other along the Y-Y' direction of FIG. 16. On the other hand, the dots 33 formed in the both side portions 28A-2 of the transmission region 28A are formed so as to have not the area of 6 of the conventional mask but the area of 10 intermediate between the area of 6 and the area of 25.

The dots 29 and 30 in the central portion 28A-1 of the transmission region 28A and the dots 33 in the both side portions 28A-2 are formed as illustrated in FIG. 16, whereby the light transmission area can be kept constant in the central portion 28A-1 of the transmission region 28A. The both side portions 28A-2 of the transmission region 28A is not equal to the central portion 28A-1 in the light transmission area, but the both side portions 28A-2 can be set to the light transmission area intermediate between the central portion 28A-1 and the low transmission region 28B. That is, the light transmission areas of the both side portions 28A-2 of the transmission region 28A can be reduced smaller than the light transmission area of the central portion 28A-1.

As described above, when the areas of the dot 33 of the both side portions 28A-2 is made larger than that of the conventional grating mask, as illustrated by the dotted line 34 of FIG. 15, the light transmittances of the both side portions 28A-2 of the transmission region 28A can be prevented from being increased beyond necessity, and the light transmittances of the both side portions 28A-2 can be decreased lower than that of the central portion 28A-1.

Specifically, the area of the dot 33 in each of the both side portions 28A-2 is selected such that the transmittances of the both side portions 28A-2 are lower than the transmittance of the central portion 28A-1.

That is, in the grating mask 28, the light transmission area of the transmission region 28A having higher transmittance is reduced lower than that of the conventional grating mask in the portion, such as the boundary portion between the low transmission region 28B and the transmission region 28A-1 or the boundary portion of the transmission region 28A-1, in which the transmittance discontinuously changes. The light transmittance prevented from being increased beyond necessity by applying the grating mask 28.

Figure 17:
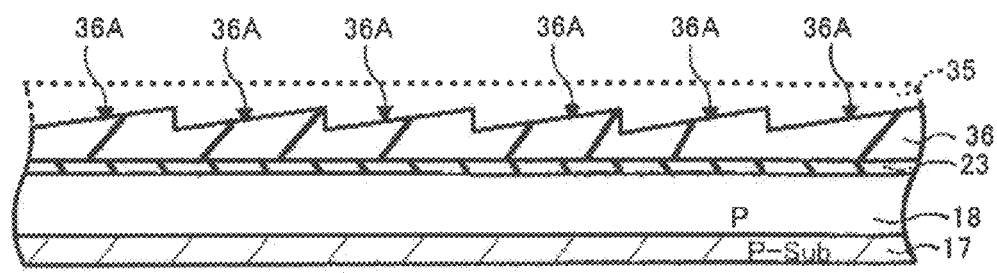
FIG. 17 is a view illustrating a process of manufacturing a resist film used to form a third impurity layer of FIG. 10.
Figure 18:
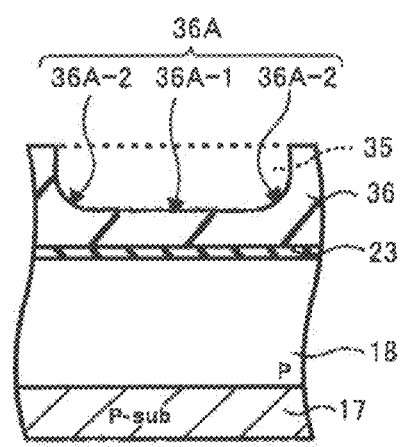
FIG. 18 is a view illustrating the process of manufacturing the resist film used to form the third impurity layer of FIG. 11.
Figure 19:
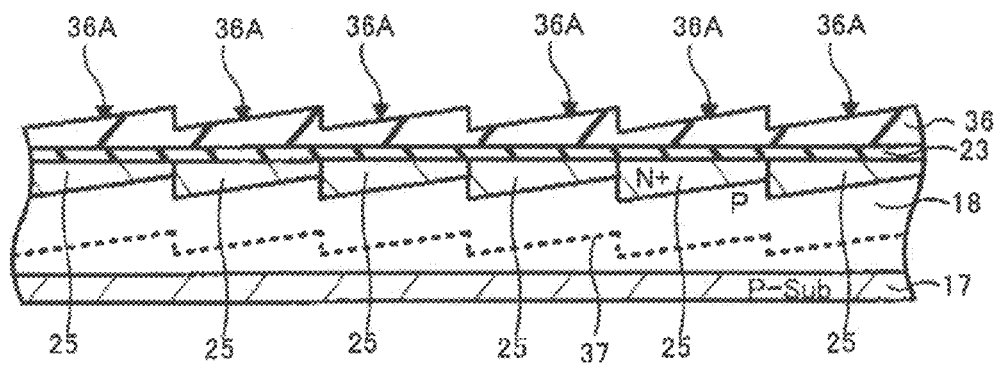
FIG. 19 is a view illustrating a process of manufacturing the third impurity layer of FIG. 10.
Figure 20:
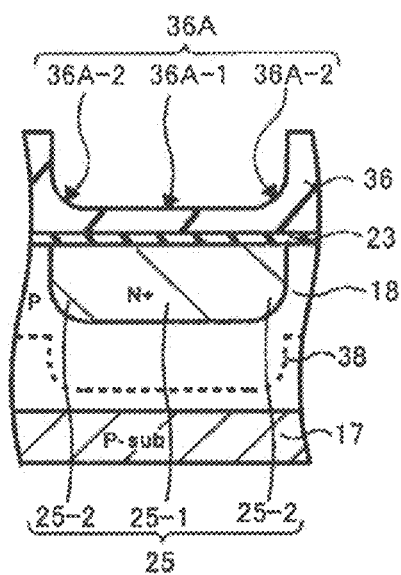
FIG. 20 is a view illustrating the process of manufacturing the third impurity layer of FIG. 11.

A method for manufacturing the CCD unit 15 with the grating mask 28 will be described below with reference to FIG. 17 to FIG. 20. FIG. 17 and FIG. 19 are views illustrating the method for manufacturing the CCD unit 15 and sectional views of the CCD unit 15 taken along the line C-C' of FIG. 7. FIG. 18 and FIG. 20 are views illustrating the method for manufacturing the CCD unit 15 and sectional views of the CCD unit 15 taken along the line D-D' of FIG. 7.

As illustrated in FIG. 17 and FIG. 18, the insulating film 23 is formed on the semiconductor substrate 17 in which the well 18 is formed. A resist material 35 is evenly applied on the insulating film 23. Then the grating mask 28 is disposed on the resist material 35 such that the charge transfer direction X-X' (as shown in FIG. 12) direction coincide with the C-C' direction of FIG. 7. After the grating mask 28 is disposed, the resist material 35 is exposed with the grating mask 28. Then the exposed resist material 35 is developed by dipping the resist material 35 in an alkali etching solution, for example.

A resist film 36 including a thin-film portion 36A having a film thickness corresponding to the transmittance characteristic of the transmission region 28A of the grating mask 28 is formed through the above-described processes. The grating mask 28 is formed such that the light transmittances in the leading end portion and both side portions 28A-2 of the transmission region 28A become lower than those of the conventional grating mask. Accordingly, the formation of the recess is suppressed in the leading end portion and both side portions 26A-2 of the thin-film portion 36A.

As illustrated in FIG. 18, the thin-film portion 36A is formed such that a central portion 36A-1 is thinner than the both side portions 36A-2.

As illustrated in FIG. 19 and FIG. 20, n-type ions are implanted into the well 18 with the resist film 36 including the thin-film portion 36A as the mask. At this point, the ions are more deeply implanted at the point where the film thickness of the thin-film portion 36A becomes thinner. Accordingly, the third N+-type impurity layer 25 corresponding to the film thickness of the thin-film portion 36A of the resist film 36 is formed by one step of ion implantation.

That is, the third N+-type impurity layer 25 that is continuously deepened at a constant rate toward the charge transfer direction while the recess is not formed in the leading end portion in the charge transfer direction can be formed as illustrated in FIG. 19.

Accordingly, the potential formed by the third N+-type impurity layer 25 becomes the profile corresponding to the depth profile of the region 25. That is, the formation of the potential dip is suppressed in a potential profile illustrated by a dotted line 37 of FIG. 19, and the potential profile deepened toward the charge transfer direction is formed.

On the other hand, as illustrated in FIG. 20, the third N+-type impurity layer 25 in which the both side portions 25-2 are shallower than the central portion 25-1 while the recesses are not formed in the both side portions 25-2 can be formed in a section perpendicular to the charge transfer direction.

Accordingly, the potential formed by the third N+-type impurity layer 25 becomes the profile corresponding to the depth profile of the region 25. That is, the formation of the potential dip is suppressed in a potential profile illustrated by a dotted line 38 of FIG. 20, and the potential profile in which the both side portions are shallower than the central portion is formed.

After the resist film 36 is removed by, for example, ashing and the second transfer electrodes 27 are formed at a predetermined position on the third N+-type impurity layer 25 by, for example, patterning with the insulating film 23 interposed there between. Therefore, the CCD unit 15 illustrated in FIG. 10 and FIG. 11 can be produced.

According to the solid-state imaging device manufacturing method of the first embodiment, the potential dip is prevented from being generated in the potential profile formed by the third N+-type impurity layer 25.

The solid-state imaging device manufactured by the method according to the first embodiment includes the third N+-type impurity layer 25 that is deepened at a constant rate toward the charge transfer direction while the recess is not formed in the leading end portion in the charge transfer direction. Accordingly, a residual image characteristic can be improved while the charge can efficiently be transferred.

The solid-state imaging device manufactured by the method according to the first embodiment includes the third N+-type impurity layer 25 in which the both side portions 25-2 are shallower than the central portion 25-1 while the recesses are not formed in the both side portions 25-2 in the section perpendicular to the charge transfer direction. Accordingly, the charge transfer characteristic can be improved.

As described above, according to the method of the first embodiment for manufacturing a solid-state imaging device, the solid-state imaging device can be produced in which the charge transfer efficiency is improved in comparison to that of the conventional one.

Specifically, the inventors confirmed the following results. The COD unit 15 in which 700 steps of the third N+-type impurity layers 25 were formed had the transfer efficiency of 95%. On the other hand, the conventional CCD unit had the transfer efficiency of about 80%. Accordingly, according to the COD unit 15 manufactured by the method of the first embodiment for manufacturing a solid-state imaging device, the transfer efficiency was improved by about 15% compared with the conventional CCD unit. The residual image characteristic was improved by about 30%.

(Second Embodiment)

A method for manufacturing a solid-state imaging device according to a second embodiment of the invention will be described below. Only the point different from the method for manufacturing a solid-state imaging device of the first embodiment will be described below.

The method for manufacturing a solid-state imaging device according to the second embodiment differs from the method of the first embodiment in the grating mask. A method for forming a second N-type impurity layer of a charge accumulation unit with a grating mask different from the grating mask 28 of FIG. 16 will be described in the second embodiment.

A plan view of the solid-state imaging device manufactured by the manufacturing method according to the second embodiment is similar to FIG. 7. In the solid-state imaging device of the second embodiment, the section taken along the line C-C' of FIG. 7 and the section taken along the line D-D' of FIG. 7 are similar to those shown in FIG. 10 and FIG. 11.

Figure 21:
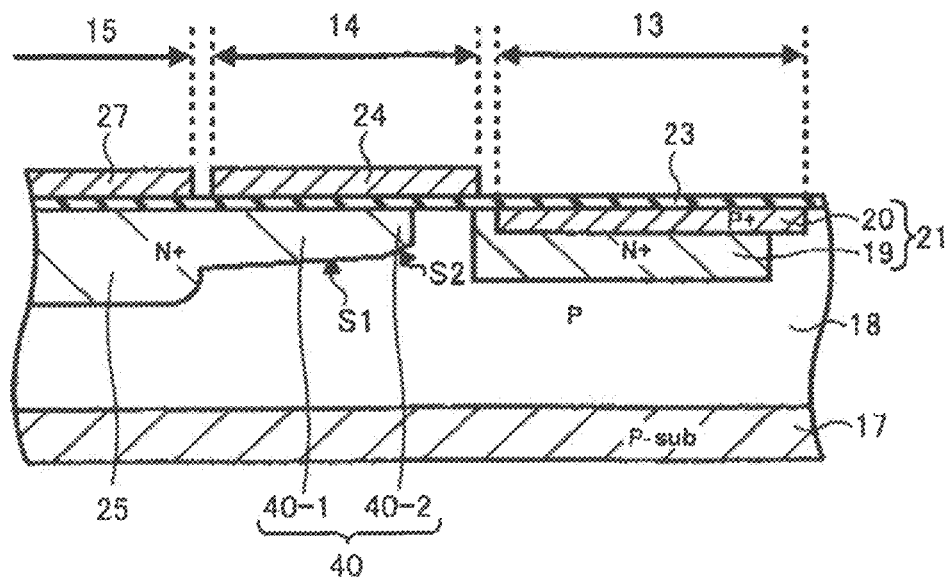
FIG. 21 is a sectional view illustrating a pixel unit and a charge accumulation unit of a solid-state imaging device manufactured by a manufacturing method of a solid-state imaging device according to a second embodiment of the invention.
Figure 22:
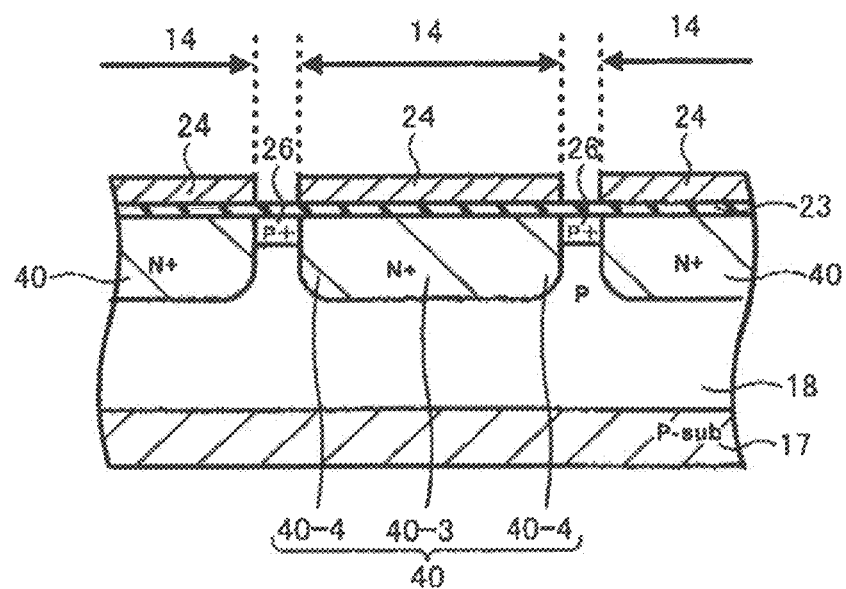
FIG. 22 is a sectional view illustrating the charge accumulation unit of the solid-state imaging device manufactured by a manufacturing method of a solid-state imaging device according to the second embodiment of the invention.

FIG. 21 is a sectional view corresponding to FIG. 8 and illustrates the solid-state imaging device manufactured by the method according to the second embodiment. FIG. 22 is a sectional view corresponding to FIG. 9 and illustrates the solid-state imaging device manufactured by the method according to the second embodiment.

As illustrated in FIG. 21, a second N+-type impurity layer 40 includes a front-step portion 40-1 and a rear-step portion 40-2. The front-step portion 40-1 and the rear-step portion 40-2 are formed such that the impurity depth is deepened toward the charge transfer direction. A gradient S2 of the depth of the rear-step portion 40-2 is configured to be larger than a gradient S1 of the depth of the front-step portion 40-1.

As illustrated in FIG. 22, the second N+-type impurity layer 40 is formed such that impurity depths of both side portions 40-4 are shallower than an impurity depth of a central portion 40-3.

A grating mask 41 used to form the second N+-type impurity layer 40 will be described below with reference to FIG. 23 to FIG. 26.

Figure 23:
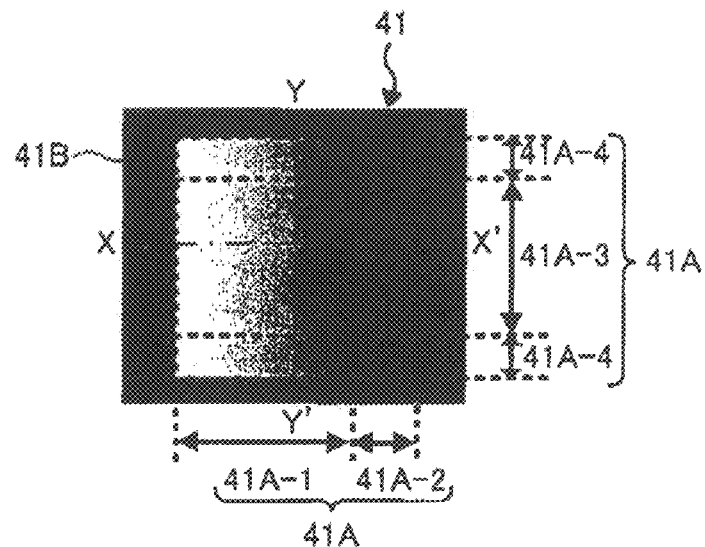
FIG. 23 is a plan view of a grating mask used in the solid-state imaging device manufacturing method according to the second embodiment of the invention.

FIG. 23 is a plan view illustrating a structure of the grating mask 41. As illustrated in FIG. 23, similarly to the grating mask 28 of FIG. 12, the grating mask 41 has the structure in which a transmission region 41A is surrounded by a low transmission region 41B where the light is hardly transmitted and the light transmittance in the transmission region 41A is gradually changes according to the position.

The transmission region 41A includes a front-step portion 41A-1 used to form the front-step portion 40-1 of the second N+-type impurity layer 40 and a rear-step portion 41A-2 used to form the rear-step portion 40-2. Each of the front-step portion 41A-1 and the rear-step portion 41A-2 includes both side portions 41A-4 used to form the both side portions 40-4 of the second N+-type impurity layer 40 and a central portion 41A-3 used to form the central portion 40-3. Because the plural second N+-type impurity layers 40 are actually formed in parallel, the plural grating masks 41 are formed in parallel while the transmission regions 41A are separated from one another. However, in the following description, it is assumed that the grating mask 41 is used to form one second N+-type impurity layer 40.

Figure 24:
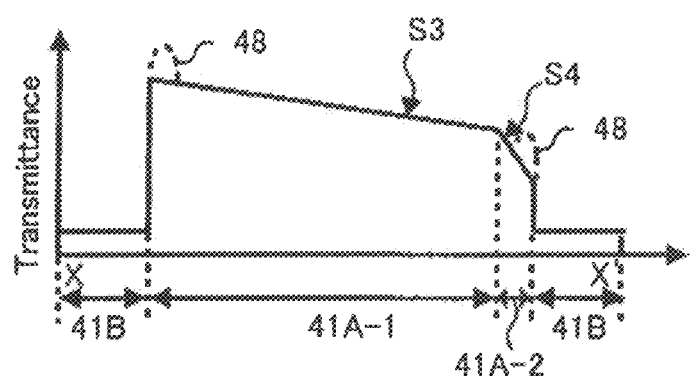
FIG. 24 is a view illustrating a transmittance of the grating mask along a line X-X' of FIG. 23.
Figure 25:
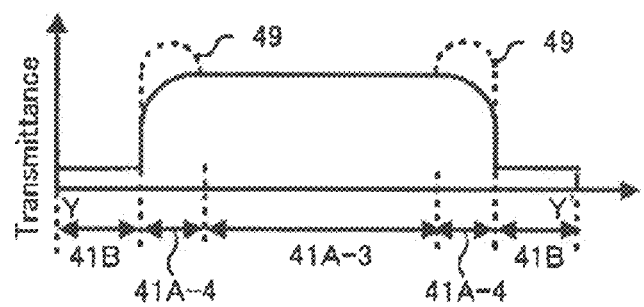
FIG. 25 is a view illustrating the transmittance of the grating mask along a line Y-Y' of FIG. 23.

FIG. 24 is a view illustrating a transmittance characteristic of the grating mask 41 along a line X-X' of FIG. 23, and FIG. 25 is a view illustrating a transmittance characteristic of the grating mask 41 along a line Y-Y' of FIG. 23. In FIG. 24 and FIG. 25, the horizontal axis indicates a position along the X-X' direction and Y-Y' direction in the grating mask 41 and a vertical axis indicates the transmittance.

As illustrated in FIG. 24, the light transmittance along the X-X' direction (charge transfer direction) of FIG. 23 is continuously increased at a constant gradient S3 toward the charge transfer direction in the front-step portion 41A-1 of the transmission region 41A. In the rear-step portion 41A-2 of the transmission region 41A, the transmittance is continuously increased toward the charge transfer direction (X-X' direction) at a gradient S4 larger than the gradient S3 of the front-step portion 41A-1.

As illustrated in FIG. 25, the both side portions 41A-4 are lower than the central portion 41A-3 in the light transmittance along the line Y-Y' of FIG. 23.

Figure 26:
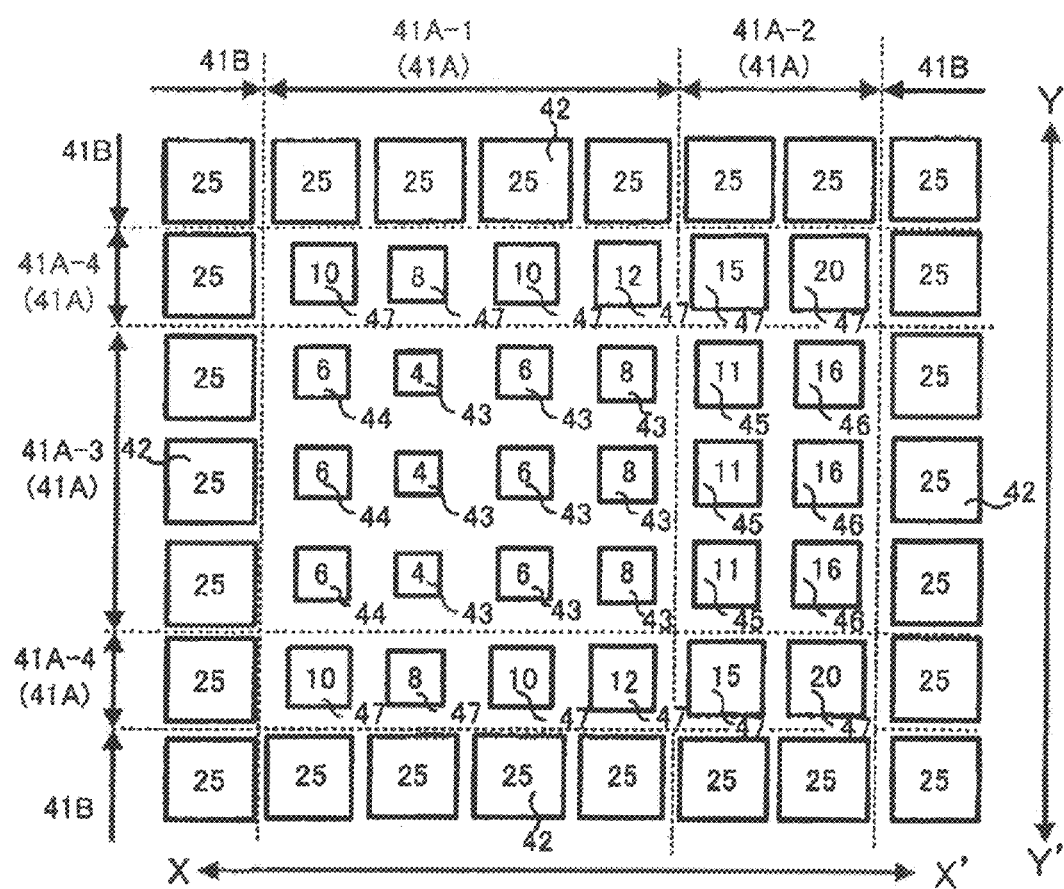
FIG. 26 is an enlarged view schematically illustrating a part of the grating mask of FIG. 23.

FIG. 26 is an enlarged plan view schematically illustrating a part of the grating mask 41. In FIG. 26, similarly to FIG. 16, the small and large squares express the dots through which light is not transmitted. A numerical value indicated in the dot indicates a relative area of each dot, and the area of the dot increases as the numerical value increases. In FIG. 26, the X-X' direction and Y-Y' direction correspond to those in FIG. 23, respectively.

As illustrated in FIG. 26, in the low transmission region 418 of the grating mask 91, dots 42 having larger areas are arrayed in the X-X' direction and Y—Y' direction so as to surround the transmission region 41A. In FIG. 26, for example, the dot 42 has the area of 25.

A plurality of dots 43 the area of which are gradually reduced along the X-X' direction, the charge transfer direction, is formed in the front-step portion 41A-1 of the transmission region 41A. Similarly to FIG. 16, a plurality of dots 44 are formed in the leading end portion of the front-step portion 41A-1 so as to have an area intermediate between the dot 42 and dot 43, which are adjacent to the dot 44 in the X-X' direction of FIG. 26.

A plurality of dots 45 the area of which are reduced at an area reduction rate larger than that along the charge transfer direction of the dot 43 of the front-step portion 41A-1 is formed in the rear-step portion 41A-2 of the transmission region 41A. Each of dots 46 arrayed in the rear end portion of the rear-step portion 41A-2 is formed so as to have an area intermediate between the dot 45 and dot 42, which are adjacent to the dot 46 in the X-X' direction of FIG. 26.

Specifically, when the area reduction rate is 2 along the charge transfer direction of the dots 43 arrayed in the front-step portion 41A-1, the area reduction rate becomes 3 along the charge transfer direction of the dots 45 arrayed in the rear-step portion 41A-2. Each of the dots 46 arrayed in the rear end portion of the rear-step portion 41A-2 is formed so as to have the area of 16 intermediate between the dot 45 having the area of 11 and the dot 42 having the area of 25, which are adjacent to the dot 46.

The area intermediate between the dot 44 in the leading end portion of the front-step portion 41A-1 and the dot 46 in the rear end portion of the rear-step portion 41A-2 is selected similarly to the area of the dot 30 of FIG. 16

Similarly to the dot pattern in FIG. 16, dots 47 are formed in the both side portions 41A-4 of the transmission region 41A such that each dot 47 has the area intermediate between each of the dots 42 arrayed in low transmission region 41B and each of the dots 43 to 46 arrayed in the central portion 41A-3.

The area of the dot 47 is selected similarly to the area of the dot 33 of FIG. 16.

The transmittance characteristic can be achieved by appropriately forming the dot patterns 42 to 47 as illustrated in FIG. 26, in which the transmittance is continuously increased at a constant rate along the charge transfer direction in both the front-step portion 41A-1 and the rear-step portion 41A-2 as illustrated in FIG. 24 while prevented from being increased beyond necessity as illustrated by a dotted line 48 of FIG. 24 in the leading end portion of the front-step portion 41A-1 and the rear end portion of the rear-step portion 41A-2.

The transmittance characteristic can be achieved, in which the both side portions 41A-4 are lower than the central portion 41A-3 in the light transmittance as illustrated in FIG. 25 while the light transmittance of the both side portions 41A-4 is prevented from being increased beyond necessity as illustrated by a dotted line 49 of FIG. 25.

Figure 27:
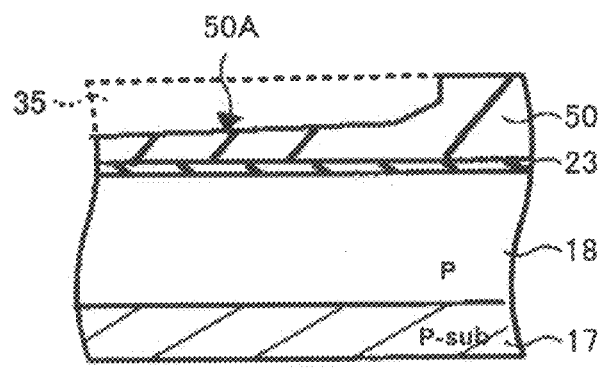
FIG. 27 is a view illustrating a process of manufacturing a resist film used to form a second impurity layer of FIG. 21.
Figure 28:
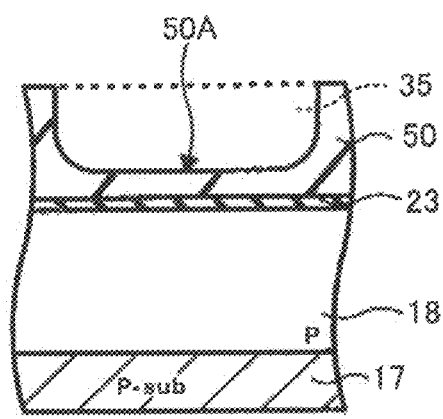
FIG. 28 is a view illustrating the process of manufacturing the resist film used to form the second impurity layer of FIG. 22.
Figure 29:
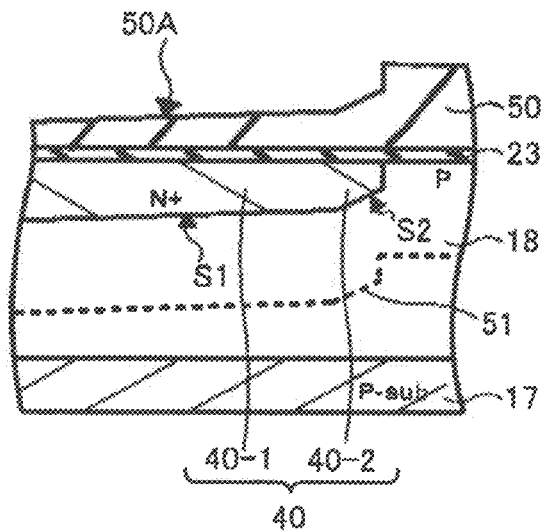
FIG. 29 is a view illustrating a process of manufacturing the second impurity layer of FIG. 21.
Figure 30:
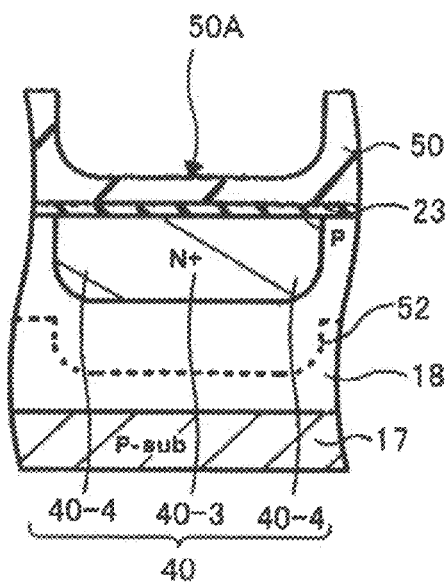
FIG. 30 is a view illustrating a process of manufacturing the second impurity layer of FIG. 22.

A method for manufacturing the charge accumulation unit 14 with the grating mask 41 will be described below with reference to FIG. 27 to FIG. 30. FIG. 27 and FIG. 29 are views illustrating the method for manufacturing the charge accumulation unit 14 and sectional views of the charge accumulation unit 14 taken on the line A-A' of FIG. 7. FIG. 28 and FIG. 30 are views illustrating the method for manufacturing the charge accumulation unit 14 and sectional views of the charge accumulation unit 14 taken along the line B-B' of FIG. 7. The method will briefly be described because only the grating mask 41 is different from that of the method for manufacturing the CCD unit 15.

As illustrated in FIG. 27 and FIG. 28, the resist material 35 is evenly applied on the insulating film 23. Then the grating mask 41 is disposed such that the X-X' direction is matched with the A-A' direction of FIG. 7. After the grating mask 41 (not shown) is disposed, the resist material 35 is exposed through the grating mask 41, and then the resist material 35 is developed.

A resist film 50 including a thin-film portion 50A having a film thickness corresponding to the transmittance characteristic of the transmission region 41A of the grating mask 41 is formed through a sequence of processes. The grating mask 41 is formed such that the light transmittances in the leading end portion of the front-step portion 41A-1 of the transmission region 41A, the rear end portion of the rear-step portion 41A-2, and both side portions 41A-4 become lower than those of the conventional grating mask. Accordingly, the formation of the recess is prevented in the leading end portion, the rear end portion, and the both side portions of the thin-film portion 50A.

As illustrated in FIG. 28, the thin-film portion 50A is formed such that the both side portions are thinner than the central portion.

As illustrated in FIG. 29 and FIG. 30, n-type ions are implanted into the well 18 with the resist film 50 as the mask. Therefore, the second N+-type impurity layer 40 having the depth corresponding to the film thickness of the thin-film portion 50A is formed by one step of ion implantation.

That is, the second N+-type impurity layer 40 that is deepened toward the charge transfer direction while the recess is not formed in the leading end portion and the rear end portion in the charge transfer direction can be formed as illustrated in FIG. 29.

Accordingly, the potential formed by the second N+-type impurity layer 40 becomes the profile corresponding to the depth profile of the second N+-type impurity layer 40. That is, the potential profile deepened toward the charge transfer direction is formed without forming the potential dip illustrated by a dotted line 51 of FIG. 29.

Because the gradient of the depth of the rear-step portion 40-2 is larger than that of the front-step portion 40-1 in the second N+-type impurity layer 40, the potential profile is also formed according to the depth profile.

On the other hand, as illustrated in FIG. 30, the second N+-type impurity layer 40 in which the both side portions 40-4 are shallower than the central portion 40-3 without forming the recesses in the both side portions 40-4 can be formed in the section perpendicular to the charge transfer direction.

Accordingly, the potential formed by the second N+-type impurity layer 40 becomes the profile corresponding to the depth profile of the region 40. That is, the potential profile in which the both side portions are shallower than the central portion without forming the potential dip illustrated by a dotted line 52 of FIG. 30 is formed.

After the resist film 50 is removed by, for example, the ashing, the first transfer electrode 24 is formed at a predetermined position including the second N+-type impurity layer 40 by, for example, the patterning with the insulating film 23 interposed there between. Therefore, the charge accumulation unit 14 illustrated in FIG. 21 and FIG. 22 can be manufactured.

According to the method for manufacturing a solid-state imaging device according to the second embodiment, the generation of the potential dip is prevented in the potential profile formed by the second N+-type impurity layer 40.

The solid-state imaging device manufactured by the method of the second embodiment includes the second N+-type impurity layer 40 that is deepened toward the charge transfer direction without forming the recess in the leading end portion and rear end portion in the charge transfer direction. Accordingly, a residual image characteristic can be improved while the charge can efficiently be transferred.

Because the gradient of the depth of the rear-step portion 40-2 is larger than that of the front-step portion 40-1 in the second N+-type impurity layer 40, the charge transfer characteristic can further be improved.

The solid-state imaging device manufactured by the method of the second embodiment includes the second N+-type impurity layer 40 in which the both side portions 40-2 are shallower than the central portion 40-1 while the recesses are not formed in the both side portions 40-4 in the section perpendicular to the charge transfer direction. Accordingly, the charge transfer characteristic can be improved.

As described above, according to the method for manufacturing a solid-state imaging device according to the second embodiment, the charge transfer efficiency can be improved more than that of the solid-state imaging device manufactured by the method according to the first embodiment.

The method for manufacturing a solid-state imaging devices according to the first and second embodiments and the solid-state imaging devices manufactured by the methods are described above. However, the invention is not limited to the embodiments.

For example, although the grating mask 28 used in the first embodiment and the grating mask 41 used in the second embodiment are separated as different masks, the grating masks 28 and 41 are combined into one mask, and the third N+-type impurity layer 2S and the second N+-type impurity layer 40 may be formed in one step process.

The photodiode 21, that is, the first N+-type impurity layer 19 and the first P+-type impurity layer 20 shown in FIG. 8 may be formed using the grating mask 28 used in the first embodiment or the grating mask 41 used in the second embodiment.

The area ratios, the shapes, and numerical values of the dots 29, 30, 32, 33 and 42 to 47 constituting the dot patterns formed in the grating mask 28 of the first embodiment and the grating mask 41 of the second embodiment are simplified for the sake of convenience. However, the invention is not limited to the area ratios, the shapes, and numerical values of the dots. That is, the grating mask according to the embodiments of the invention includes all the mask that are formed such that the light transmission area is reduced in the area having the higher transmittance in the transmittance boundary portion having the large difference in transmittance.

Accordingly, the grating mask according to the embodiments may be produced such that the chromium film having the light shielding characteristic is evenly formed on the transparent resin substrate, and the dot pattern is formed by openings on the chromium film, wherein each of the openings has a light transmission area varying with position of the openings formed in the chromium film. The invention can be applied to a grating mask that is formed by adjusting density of the dot pattern through which the light is shielded or transmitted, instead of adjusting the areas of dots in a dot pattern having a constant density.

In the description of the present invention, the term "mask" or "exposure mask" includes design data used to form the mask in addition to the mask such as the grating mask described in the embodiments according to the present invention.

The present invention is not restricted to the particular conductive type for the semiconductor substrate or the impurity layer, which are formed in the solid-state imaging devices according to the first and second embodiments.

A line sensor module according to a third embodiment of the present invention will be described below, in which the solid-state imaging device manufactured by the method for manufacturing a solid-state imaging devices according to the first and second embodiments is used.

(Third Embodiment)

The solid-state imaging device according to the third embodiment is a line sensor module in which the method for manufacturing a solid-state imaging device according to the first embodiment is used. However, the solid-state imaging device manufactured by the method according to the second embodiment may be used as the line sensor module.

Figure 31:
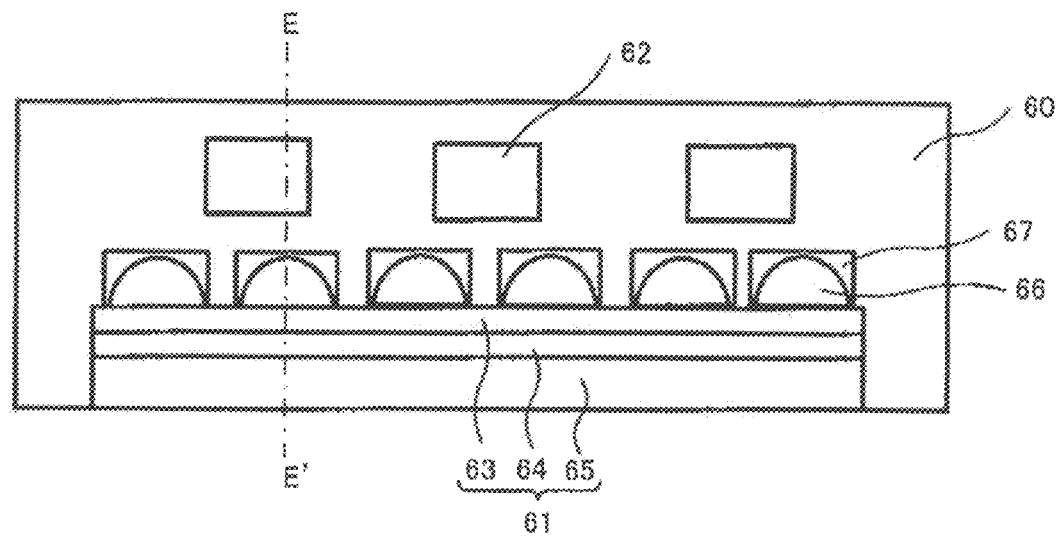
FIG. 31 is a plan view illustrating a main part of a solid-state imaging device according to a third embodiment of the invention.
Figure 32:
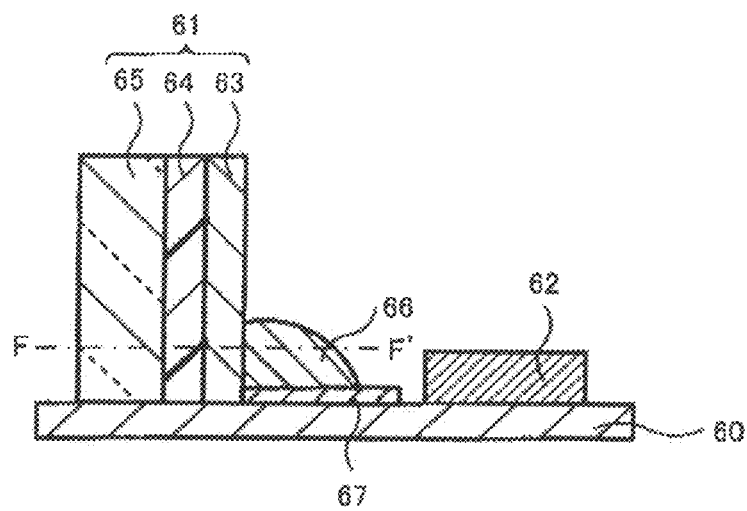
FIG. 32 is a sectional view of the solid-state imaging device taken along a line E-E' of FIG. 31.
Figure 33:
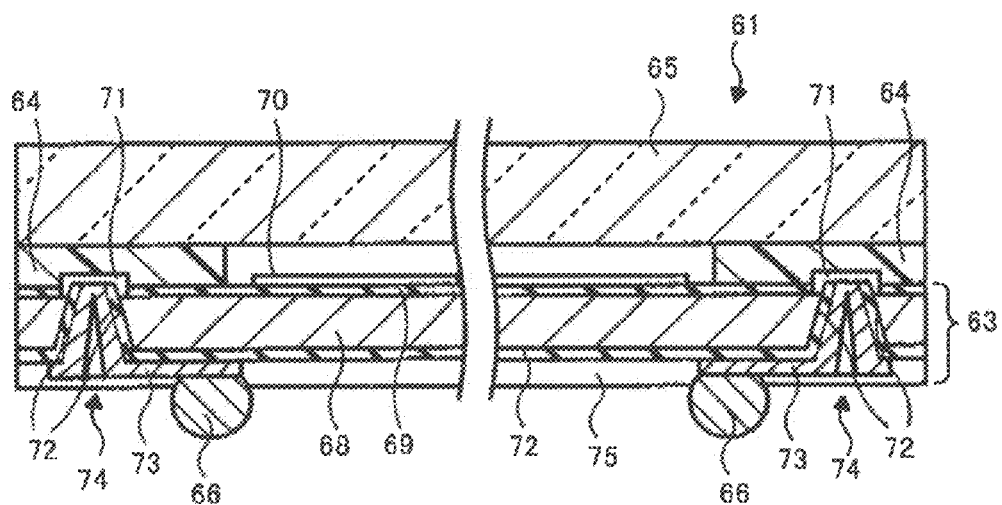
FIG. 33 is a sectional view of the solid-state imaging device taken along a line F-F' of FIG. 32.

FIG. 31 is a plan view illustrating the line sensor module of the third embodiment. FIG. 32 is a sectional view of the solid-state imaging device taken along a line E-E' of FIG. 31 and FIG. 33 is a sectional view of the solid-state imaging device taken along a line F-F' of FIG. 32.

As illustrated in FIG. 31, in the line sensor module, a solid-state imaging device 61 including the solid-state imaging device of the first embodiment and plural semiconductor components 62 are mounted on a surface of a printed board 60.

The solid-state imaging device 61 including a sensor board 63, a glass substrate 65 and a bonding agent 64 is disposed on the surface of the sensor board 63. A bonding agent 64 is applied on or formed on the surface of the sensor substrate 63 so as to bond it with the glass substrate. Plural solder balls 66 are formed on a rear surface of the sensor substrate 63.

The solid-state imaging device 61 is mounted on the surface of the printed board 60 such that the plural solder balls 66 come into contact with plural electrodes 67 provided on the surface of the sensor substrate 63.

FIG. 32 is a sectional view of the line sensor module taken on a line E-E' of FIG. 31. As illustrated in FIG. 32, the solid-state imaging device 61 is mounted on the surface of the printed board 60 such that the light receiving surface, that is, the surface of the glass board 65 becomes perpendicular to the printed board 61.

The plural solder balls 66 provided in the solid-state imaging device 61 are formed on the surface in which the solid-state imaging device 61 is in contact with the printed board 12.

FIG. 33 is a sectional view of the solid-state imaging device 61 taken on a line F-F' of FIG. 32. The solid-state imaging device 61 will be described in detail with reference to FIG. 33. As illustrated in FIG. 33, the sensor board 63 constituting the solid-state imaging device 61 includes a semiconductor substrate 68 made of, for example, silicon. A first insulating film 69 is formed on the surface of the semiconductor substrate 68, and the solid-state imaging element 70 is disposed on the first insulating film 69. The solid-state imaging element 70 is the solid-state imaging device manufactured by the method according to the first embodiment of the present invention.

Part of the first insulating film 69 on the semiconductor substrate 68 is removed and a pad 71 is formed in the region where the first insulating film 69 is removed. A through-hole penetrating the semiconductor substrate 68 is made below the pad 71. The pad 71 is electrically conducted to the solid-state imaging element 70 through wiring (not illustrated) formed on the surface of the semiconductor substrate 68.

A second insulating film 72 is formed in a side face of the through-hole. A metallic film 73 is formed on the surface of the second insulating film 72 so as to be connected to the pad 71. A penetration electrode 74 is formed by the second insulating film 72 and the metallic film 73, which are formed in the through-hole.

The second insulating film 72 is also formed on the rear surface of the semiconductor substrate 68. The metallic film 73 is also formed on the rear surface of the semiconductor substrate 68 with the second insulating film 72 interposed there between. The metallic film 73 is formed into the wiring shape on the rear surface of the semiconductor substrate 68.

A solder resist film 75 is formed on the rear surface of the semiconductor substrate 68 including the second insulating film 72 and the wiring-shaped metallic film 73. The solder resist film 75 is formed such that part of the wiring-shaped metallic film 73 is exposed. The solder ball 66 is formed on the surface of the wiring-shaped metallic film 73 that is exposed from the solder resist film 75.

That is, the solid-state imaging element 70 is electrically conducted to the solder ball 66 through wiring (not illustrated) formed on the surface of the semiconductor substrate 68, the penetration electrode 73, and the wiring-shaped metallic film 73 formed on the rear surface of the semiconductor substrate 68.

The bonding agent 64 is provided on the surface of the sensor board 63 including the solder ball 66, that is on the semiconductor substrate 68 with the first insulating film 69 interposed there between, and the glass board 65 is disposed and fixed onto the sensor board 63 with the bonding agent 64 interposed there between.

The solid-state imaging device 61 is mounted on the surface of the printed board 60 so as to become perpendicular to the printed board 60.

The line sensor module is assembled as follows. The solid-state imaging device 61 is disposed perpendicular to the printed board 60, and the solder ball 66 of the solid-state imaging device 61 is brought into contact with the electrode 67 of the printed board 60. Then the solid-state imaging device 61 is fixed to the surface of the printed board 60 by heating the whole of the printed board 60. Thus, the line sensor module is completed.

The line sensor module acts as the sensor although the line sensor module has the chip size. Specifically, the light reflected from the original is incident to the direction parallel to the printed board 60, and the light is received by the solid-state imaging element 70 of the solid-state imaging device 61, which allows the original to be read.

The line sensor module is superior to the conventional solid-state imaging element in the charge transfer efficiency of the solid-state imaging element 70 constituting the line sensor module. Accordingly, performance of the line sensor module can be improved.

In the line sensor module, the solid-state imaging device 61 is rigidly mounted on the surface of the printed board 60 while supported by the solder ball 66. Accordingly, the line sensor module having the excellent reliability is provided.

Thus, the line sensor module of the third embodiment is described. However, the present invention is not limited to the third embodiment. For example, the invention can be applied to a so-called lens reduced type line sensor in which the line sensor module is mounted in a lens retaining body that retains a lens therein. The present invention can be applied to a so-called contact type line sensor. In the contact type line sensor, plural solid-state imaging devices 61 are mounted in a line on the surface of the printed board 60, a self-focus lens array is mounted in parallel with the line of the solid-state imaging devices 61, and a light guide that guides the light emitted from a light source and outputs the light toward the original is formed on the rear surface of the printed board 60. In the contact type line sensor, there is no restriction to the shape of the printed board 60. For example, the printed board may be formed into an arc shape, or plural printed boards may be connected.

While certain embodiments have been described, these embodiments have been presented by way of example only, and are not intended to limit the scope of the inventions. Indeed, the exposure mask, the method for manufacturing the semiconductor device including the impurity layer, and the solid-state imaging device described herein may be embodied in a variety of other forms; furthermore, various omissions, substitutions and changes in the form of the exposure mask, the method for manufacturing the semiconductor device including the impurity layer, and the solid-state imaging device described herein may be made without departing from the spirit of the inventions. The accompanying claims and their equivalents are intended to cover such forms or modifications as would fall within the scope and spirit of the inventions.

What is claimed is:

1. An exposure mask comprising:
a first transmission region including a plurality of dots, having substantially an identical area through which light is shielded or transmitted, arrayed into a matrix form having rows and columns, the first transmission region having a first length in the row direction of the matrix form; and
a second transmission region including a plurality of dots, having substantially an identical area through which the light is shielded or transmitted, arrayed into a matrix form having rows and columns, the second transmission region disposed adjacent to the first transmission region, the area of the dots arrayed in the second transmission region being greater than the area of the dots arrayed in the first transmission region, the second transmission region having a second length in the row direction of the matrix form, wherein
the dots arrayed in a column of the first transmission region, which is adjacent to the second transmission region, have an area intermediate between areas of dots arrayed on both sides of the column, and the dots arrayed in the column of the first transmission region form a transient region having a length smaller than the length of the first region except for the transient region or the second transmission region.

2. The exposure mask according to claim 1, wherein a direction of the row is a charge transfer direction, a light transmittance is substantially kept constant in each of the first and second transmission regions, and the first and second transmission regions are formed such that the light transmittances of the first and second transmission regions are increased in a stepwise manner toward the charge transfer direction.

3. The exposure mask according to claim 2, wherein the dots arrayed in each of the first and second transmission regions have a square shape.

4. The exposure mask according to claim 3, wherein the dots arrayed in each of the first and second transmission regions are formed by a light shielding film, and the light shielding film is formed on a transparent substrate.

5. The exposure mask according to claim 4, wherein the light shielding film is a chromium film, and the transparent substrate is a glass or resin substrate.

6. An exposure mask comprising:
a first transmission region including a plurality of dots, through which light is shielded or transmitted, arrayed into a matrix form having rows and columns, the first transmission region having a first length in the row direction of the matrix form; and
a second transmission region including a plurality of dots, through which light is shielded or transmitted, arrayed into a matrix form having rows and columns, the second transmission region disposed adjacent to the first transmission region, the second transmission region having a second length in the row direction of the matrix form, wherein
the areas of the plurality of dots arrayed in the first and second transmission regions are gradually reduced along the row direction,
the dots arrayed in a column of the first transmission region, which is adjacent to the second transmission region, have an area intermediate between areas of dots arrayed on both sides of the column, and
the dots arrayed in the column of the first transmission region form a transient region having a length smaller than the length of the first region except for the transient region or the second transmission region.

7. The exposure mask according to claim 6, wherein the row direction is a charge transfer direction, and the first and second transmission regions are formed such that a light transmittance is increased toward the charge transfer direction, the areas of the plurality of dots arrayed in the first and second transmission regions being substantially identical along the column direction.

8. The exposure mask according to claim 7, wherein the dots arrayed in each of the first and second transmission regions have a square shape.

9. The exposure mask according to claim 7, wherein low transmission regions, provided on both sides of the first and the second transmission regions, having a plurality of dots, through which light is shielded or transmitted, are arrayed along the row direction, areas of the plurality of dots in the low transmission regions are larger than the areas of the plurality of dots in the first and the second transmission regions,
boundary transmission regions, provided between the low transmission regions and the first and the second transmission regions, having a plurality of dots, through which light is shielded or transmitted, are arrayed along the row direction, and areas of the plurality of dots in the boundary transmission regions are intermediate between areas of dots in the low transmission regions and the first and the second transmission regions.

10. The exposure mask according to claim 8, wherein the dots arrayed in each of the first and second transmission regions are formed by a light shielding film, and the light shielding film is formed on a transparent substrate.

11. The exposure mask according to claim 10, wherein the light shielding film is a chromium film, and the transparent substrate is a glass or resin substrate.

* * * * *